United States Patent
Fonash et al.

(10) Patent No.: US 6,361,912 B2
(45) Date of Patent: Mar. 26, 2002

(54) ELECTROSTATIC PRINTING OF A METALLIC TONER APPLIED TO SOLID PHASE CRYSTALLIZATION AND SILICIDATION

(75) Inventors: Stephen J. Fonash; Ali Kaan Kalkan, both of State College, PA (US); Robert H. Detig, New Providence, NJ (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/757,306

(22) Filed: Jan. 8, 2001

Related U.S. Application Data

(60) Provisional application No. 60/090,663, filed on Jun. 25, 1998.

(51) Int. Cl.$^7$ ............................................... G03G 13/16
(52) U.S. Cl. ......................... 430/52; 430/126; 438/486
(58) Field of Search ................... 430/52, 126; 438/436

(56) References Cited

U.S. PATENT DOCUMENTS

| | | | |
|---|---|---|---|
| 3,897,285 A | 7/1975 | Hamilton et al. | 149/41 |
| 3,900,412 A | 8/1975 | Kosel | 252/62.1 |
| 4,262,040 A | 4/1981 | Russo | 427/229 |
| 5,147,826 A | 9/1992 | Liu et al. | 437/233 |
| 5,275,826 A | 1/1994 | Badylak et al. | 424/551 |
| 5,275,851 A | 1/1994 | Fonash et al. | 427/578 |
| 5,332,646 A | 7/1994 | Wright et al. | 430/137 |
| 5,543,352 A | 8/1996 | Ohtani et al. | 437/101 |
| 5,585,291 A | 12/1996 | Ohtani et al. | 437/40 |
| 5,612,250 A | 3/1997 | Ohtani et al. | 437/101 |
| 5,643,826 A | 7/1997 | Ohtani et al. | 437/88 |
| 5,654,203 A | 8/1997 | Ohtani et al. | 438/97 |
| 5,904,770 A | * 5/1999 | Ohtani et al. | 117/103 |
| 5,985,741 A | * 11/1999 | Yamazaki et al. | 438/486 |
| 6,036,889 A | 3/2000 | Kydd | 252/512 |
| 6,153,348 A | 11/2000 | Kydd et al. | 430/119 |
| 6,171,740 B1 | * 1/2001 | Fonash et al. | 430/52 |

OTHER PUBLICATIONS

Wicks. *Film Formation*. 1986 by Federation of Societies for Coatings Technology.
Barrett et al. "The Preparation of Polymer Dispersions in Organic Liquids". *Dispersion Polymerization in Organic Media*. Chapter 5, pp. 201–241, 1975.
Napper, *Polymer Stabilization of Colloidal Dispersions*. Academic Press, London, pp. 18–30, 1983.
Czubatyj et al. "Low–Temperature Polycrystallin–Silicon TFT on 7059 Glass". *IEEE Electron Device Letters*, vol. 10, No. 8, Aug. 1989.
Liu et al. "Low Thermal Budget Poly–Si Thin Film Transistors on Glass". *Japanese Journal of Applied Physics*. vol. 30, No. 2B, Feb. 1991, pp. 269–271.

* cited by examiner

*Primary Examiner*—John Goodrow
(74) *Attorney, Agent, or Firm*—Ohlandt, Greeley, Ruggiero & Perle, L.L.P.

(57) ABSTRACT

A metal-containing toner is electrostatically printed on a semiconductor surface. Subsequently, this surface is annealed to achieve certain material modifications selectively at the regions where the toner is applied. If the toner contains a crystallization-catalyst metal, such as, Pd, Ni, Pt, and Cr, and is printed on an amorphous semiconductor film, annealing results in conversion of the printed regions to polycrystalline. If the metal-containing toner is printed on a silicon surface (i.e., amorphous/poly-Si layer or Si wafer) the printed regions are selectively converted to a metal-silicide (with the sufficient amount of metal applied on these regions) upon annealing.

22 Claims, 2 Drawing Sheets

ELECTROSTATIC PRINTING OF A METALLIC TONER APPLIED TO SOLID PHASE CRYSTALLIZATION AND SILICIDATION

This Application claims benefit from U.S. Ser. No. 09/340,009 filed Jun. 25, 1999 now U.S. Pat. No. 6,171,740 and U.S. Provisional Patent Application Ser. No. 60/090,663, filed Jun. 5, 1998.

FIELD OF THE INVENTION

This invention relates to a method and apparatus for crystallizing amorphous films into polycrystalline films and, more particularly, to an electrostatic printing method and apparatus for selective deposition of catalyst metals to achieving such selective crystallization. This invention also relates to a method and apparatus for forming metal silicide regions on amorphous/poly-Si films or Si wafers and, more particularly, to an electrostatic printing method and apparatus for selective deposition of metals of the metal silicides to achieving such selective silicidation.

BACKGROUND OF THE INVENTION

Large area amorphous silicon layers are widely used to make the transistors used for flat panel display devices. Indeed the most widely used flat panel display, i.e., the active matrix liquid crystal display (AMLCD), derives its name from an active matrix of transistors that are arranged in both the X and Y directions. A transistor made from amorphous silicon is placed at each picture element (pixel) in each color for a color display (red, green, and blue).

Transistors made from amorphous silicon exhibit low performance characteristics (compared to those made from single crystal silicon), with low carrier mobility being a determining property. Researchers have recognized that converting amorphous silicon to poly crystalline silicon (poly-Si) will enhance performance considerably, even to a significant fraction of the performance of single crystal silicon, the material from which all integrated circuits are made.

Studies of poly-Si thin film transistors have concentrated on methods for reducing their fabrication costs, either by reducing the transistors' processing time or by lowering the processing temperatures. The latter effect is important since it allows the usage of less expensive substrates for the transistor arrays, e.g., glass, plastic, etc. For instance, Czubatyj et al. in "Low-Temperature Polycrystalline TFT on 7057 Glass", IEEE Electron Device Letters, Vol. 10, pages 349–351, 1989, demonstrates that polysilicon thin film transistors can be fabricated on 7059 glass substrates using relatively low temperature furnace annealing for crystallization. However, the crystallization process takes longer than 75 hours and is therefore not practically applicable.

Poly-Si films can be deposited, deposited and recrystallized, or deposited in the amorphous ($\alpha$-Si) form and then crystallized into poly-Si films. There are three principal crystallization processes: furnace annealing, rapid thermal process (RTP) and laser annealing. The first two are solid phase crystallization techniques, while the third is a liquid phase crystallization technique. Although reported laser annealing techniques have the potential for effecting low temperature crystallization, laser crystallization suffers from the need to raster the laser beam; raising throughput issues. Laser annealing also exhibits other difficulties, e.g. reproducibility, uniformity and peel-off. The most commonly used methods for producing large grain poly-Si films are furnace annealing of $\alpha$-Si films at temperatures of at least 600° C., with very long processing times (16–30 hours or longer for $\alpha$-Si films) or the RTP approach (e.g., 700° C./5 mins).

In "Low Thermal Budget Poly-Silicon Thin Film Transistors on Glass", Japanese Journal of Applied Physics, Vol. 30, pages L269-I,271, 1991, it was demonstrated that thin film transistors can be fabricated on poly-Si films made by the crystallization of pre-cursor $\alpha$-Si films. Those polycrystalline films were obtained by a rapid thermal annealing of the precursor films for five minutes at 700° C. on Corning 7059 glass substrates.

In U.S. Pat. No. 5,147,826 to Liu et al., it was shown that a thermal anneal procedure at 700° C. (for converting $\alpha$-Si to poly-Si) can be reduced to a range of from 550° C. to 650° C. This improvement is accomplished by depositing a thin discontinuous film of a nucleating site forming material over an already deposited layer of $\alpha$-Si. The $\alpha$-Si film is then rapidly thermally annealed, with the nucleating site forming material enabling crystallization of the underlying $\alpha$-Si at temperatures lower than theretofore reported.

Liu et al. also report in the '826 patent that $\alpha$-Si can be selectively crystallized by depositing the nucleating site performing material in a pattern thereon and subsequently subjecting the patternized surface to an anneal procedure. Because the nucleating site forming material is a metal, the treated surface of the subsequently crystallized silicon is not optimal for structures. As a result, additional processing steps are required to allow untreated surfaces to become boundaries for devices to be grown.

In U.S. Pat. No. 5,275,826 of Fonash et al., a fabrication process for polycrystalline silicon thin film transistors is described that commences with a deposition of an ultra-thin nucleating-site forming layer onto the surface of an insulating substrate (e.g., 7059 glass, plastic). Next, an $\alpha$-Si film is deposited thereover and the combined films are annealed at temperatures that do not exceed 600° C. By patterning the deposition of the nucleating site forming material on the glass substrate, the subsequently deposited $\alpha$-Si film can be selectively crystallized only in areas in contact with the nucleating-site forming material.

Ohtani et al. in U.S. Pat. Nos. 5,585,291, 5,612,250, 5,643,826, 5,543,352, and 5,654,203 describe a solution method for applying a catalyst metal to enhance subsequent $\alpha$-Si crystallization.

The aforesaid thus clearly indicates that catalysts can be used to reduce the time-temperature thermal budget needed for crystallization of semiconductor materials. For example, catalytic agents like palladium or nickel can be deposited by various techniques like vacuum evaporation or from solution and such catalytic agents can substantially impact the thermal budget. The crystallization time may be shortened to as low as 4 minutes at 550° C. by such metal treatments.

Each of the above-cited references has employed some form of photolithographic masking to achieve selective deposition of the catalytic metal on selected parts of a substrate. Such procedures require a number of steps and add to the cost of the ultimate product made thereby.

Accordingly, it is an object of this invention to provide an improved method and apparatus for applying a crystallization catalyst onto an amorphous semiconductor film.

Besides selective area crystallization of an amorphous film, another microelectronic fabrication process of interest involving the selective area application of a metal on an amorphous or polycrystalline Si film or a Si wafer is selective area silicidation. A wide range of noble and refractory metals form compounds with Si called suicides. As in the case of metal-induced crystallization, silicidation requires annealing of the related metal layer in contact with Si. Minimum annealing temperature depends on the silicide to be formed and varies from 400 to 1000° C. Silicides exhibit conductivities close to metals (0.1–0.01 S/cm) and in certain applications are preferable to metals where a better chemical stability or lattice match is desired. Applications of suicides include; electrical interconnects, Schottky contacts to form Schottky barrier diodes, gate electrodes in transistors, and source and drain contacts in transistors. As different from metal-induced crystallization, silicidation requires a thicker layer of metal be deposited. This is because, in crystallization, the catalyst layer (which may be pure metal, or a metal containing material) deposited acts as the catalyst or seed layer and does not need to be thicker than a few tens of Å. On the other hand, in applications of suicides as stated above, the silicide layer is required to be at least hundreds of Å. Hence, a metal layer of similar thickness (hundreds of Å) is needed which is to be consumed during silicidation process. As in the case of selective area crystallization, fabrication of silicide structures or patterns on a Si surface requires the metal layer to be patterned. Conventionally, this procedure is also performed by photolithography and requires a number of steps increasing the processing cost.

Accordingly, it is also an object of this invention to provide an improved method and apparatus for applying a metal onto a Si surface (Si wafer, amorphous/poly-Si film) with the purpose of obtaining silicide regions.

The process of the invention is simple, low cost and is much like a copy machine and enables the printing of a toner for the purpose of selective area crystallization or silicidation, preferably on a silicon layer that resides on a low cost substrate. Glass, plastics and metal foils covered by an insulating layer can be used. The patterning and image registration can be performed to high accuracy using the process of the present invention.

In the case of crystallization or silicidation of thin films according to the present invention, the process sequence may be modified by applying the catalyst-containing or metal containing toner to the substrate prior to semiconductor film deposition and annealing of the semiconductor film. The semiconductor film can be a material other than Si, e.g., carbon, germanium and alloys thereof.

SUMMARY OF THE INVENTION

The present invention is directed to a method for applying metallic toner onto an amorphous semiconductor layer with the objective of selective area crystallization, the method comprising the steps of:(a) exposing a photo-sensitive surface to cause exposed areas of the surface to crosslink and exhibit an increase in resistivity in comparison with unexposed areas of the photo-sensitive surface; (b) charging the photo-sensitive surface, the exposed areas of the photo-sensitive surface retaining a charge longer than the unexposed areas; (c) applying a toner to the photo-sensitive surface, the toner attracted by retained charge on the exposed areas; (d) juxtaposing the photo-sensitive surface toned in step (c) to a layer of amorphous semiconductor and applying an electric field therebetween to cause the toner that is adherent to the photo-sensitive surface to migrate to the amorphous semiconductor layer; and (e) annealing the toned amorphous semiconductor layer to enable formation of polycrystalline semiconductor only in areas where the toner is adherent. In another embodiment of the invention, step (d) further comprises interposing a nonconductive fluid between the photo-sensitive surface and the silicon surface prior to applying the electric field.

In one embodiment of the invention, the photo-sensitive surface comprises a material such as epoxy cationic, acrylic free radical, and photosensitive polyimide.

In another embodiment of the invention, the toner contains a metal (a) chemically, wherein the toner is a compound or solution of the metal; (b) physically, wherein the metal is contained in the toner as metal particles; or (c) both. Preferably, the metal contained in the toner is in a form selected from the group consisting of metal complex, pure metal particle, coated metal, and organometallic compound. More preferably, the toner is a material selected from the group consisting of: a resin with metal particles, an organosol with metal particles, a metallo-organic decomposition compound, and a metallo-organic decomposition compound with metal particles. The metal or the metal particle is comprised of a metal selected from the group consisting of: palladium, silver, tin, nickel, platinum, chromium and mixtures thereof.

In a further embodiment of the invention, the amorphous semiconductor layer comprises a material such as silicon, germanium, silicon-germanium, silicon-carbide, cadmium selenide, and indium antimonide. Preferably, the amorphous semiconductor layer is disposed on a substrate, which comprises at least one material, such as silicon, metal, glass, or plastic.

The present invention is also directed to a method for applying metallic toner onto an amorphous semiconductor layer with the objective or selective area crystallization, the method comprising the steps of: (a) charging a photo-sensitive surface; (b) exposing the photo-sensitive surface to an optical image or a digitally addressed beam to produce a latent image of charges on the photo-sensitive surface; (c) applying a toner to the photo-sensitive surface, the toner attracted to the charged areas of the photo-sensitive surface; (d) juxtaposing the photo-sensitive surface toned in step (c) to a layer of amorphous semiconductor and applying an electric field therebetween to cause the toner that is adherent to the photo-sensitive surface to migrate to the amorphous semiconductor layer; and (e) annealing the toned amorphous semiconductor layer to enable formation of polycrystalline semiconductor only in areas where the toner is adherent. In an embodiment of the invention, the photo-sensitive surface comprises a material such as organic photoreceptor surface, arsenic triselenide, selenium, and silicon. In another embodiment of the invention, the exposing of the photo-sensitive surface in step (b) is to an optical image or digitally addressed beam, such as, a LED or laser.

The present invention is further directed to a method for the formation of silicide on a silicon surface comprising the steps of: (a) exposing a photo-sensitive surface to cause exposed areas of the surface to crosslink and exhibit an increase in resistivity in comparison with unexposed areas of the photo-sensitive surface; (b) charging the photo-sensitive surface, the exposed areas of the photo-sensitive surface retaining a charge longer than the unexposed areas; (c) applying a toner to the photo-sensitive surface, the toner attracted by retained charge on the exposed areas; (d) juxtaposing the photo-sensitive layer surface toned in step (c) to a silicon surface and applying an electric field therebetween to cause the toner that is adherent to the photo-sensitive surface to migrate to the silicon surface; and (e) annealing the toned silicon surface thereby enabling formation of silicide only in areas where the toner is adherent. In accordance with still another embodiment of the invention, step (d) further comprises interposing a nonconductive fluid between the photo-sensitive surface and the silicon surface prior to applying the electric field.

In one embodiment of the above invention, the photo-sensitive surface comprises a material such as epoxy cationic, acrylic free radical, and photo-sensitive polyimide. The silicon surface for the above method can be amorphous, polycrystalline, or single crystalline. In an embodiment of the invention, the photo-sensitive surface comprises a material such as organic photoreceptor surface, arsenic triselenide, selenium, and silicon.

In an embodiment of the invention, the toner contains a metal as detailed above. Preferably, the metal or metal particle is a metal of the desired metal-silicide including: aluminum, cobalt, chromium, hafnium, iron, magnesium, molybdenum, nickel, niobium, palladium, platinum, tantalum, titanium, tungsten, zirconium and mixtures thereof.

In another embodiment of the invention, the silicon surface is an amorphous or polycrystalline silicon thin film disposed on a substrate. Preferably, the substrate comprises at least one material, such as, silicon, metal, glass, or plastic.

The present invention is still further directed to a method for the formation of silicide on a silicon surface comprising the steps of: (a) charging a photosensitive surface; (b) exposing the photosensitive surface to an optical image or a digitally addressed beam to produce a latent image of charges on the photosensitive surface; (c) applying a toner to the photosensitive surface, the toner attracted to the charged areas of the photosensitive surface; (d) juxtaposing the photosensitive layer surface toned in step (c) to a silicon surface and applying an electric field therebetween to cause the toner that is adherent to the photo-sensitive surface to migrate to the silicon surface; and (e) annealing the toned silicon surface thereby enabling formation of silicide only in areas where the toner is adherent. In an embodiment of the invention, the photo-sensitive surface comprises a material selected from the group consisting of: organic receptor surface, arsenic triselenide, selenium, and silicon. In one embodiment of the invention, the exposing of the photo-sensitive surface in step (b) is to an optical image or digitally addressed beam, such as, a LED or laser.

This invention utilizes electrophotography to apply a crystallization catalyst to an amorphous semiconductor layer. The catalyst is subsequently employed to convert areas of the amorphous semiconductor layer to discrete, defined polycrystalline regions.

This invention also utilizes electrophotography to apply a metal or metal containing material to a Si surface. The metal or metal containing material is subsequently employed to convert areas of the Si surface to discrete, defined metal-silicide regions.

DETAILED DESCRIPTION OF THE PREFERRED EMBODIMENT

In application to selective area crystallization a catalytic liquid toner is electrostatically printed on an amorphous silicon layer (or a substrate that is to support such a layer) in an image-wise fashion. After the liquid toner is dried, the amorphous silicon layer is heated, preferably using rapid thermal annealing, to approximately 550° C. for about 2 minutes to complete the polycrystalline conversion process. The toner used during the printing action is a dispersion of resin particles which contains a modest amount of metallic catalyst, such as palladium, silver, tin, nickel, platinum or chromium.

In application to selective area silicidation, a metal containing toner is electrostatically printed on a Si surface (Si wafer, amorphous/poly-Si layer). Upon annealing, the Si regions in contact with the metal toner are converted to metal-silicide. The conversion temperature depends on the type of silicide. For example, $Pd_2Si$ forms at ~400° C., while $WSi_2$ forms at ~1000° C.

The printing step initially forms latent images on a photo-sensitive receptor plate or drum. Images can be created either electrophotographically, as in a Xerox-graphic copier, or digitally as in a laser printer. The latent images are developed by application of a liquid toner. The toner is then transferred to the Si surface. After the toner is dried, the patterning process is complete. The printed Si surface is now heat processed to complete the crystallization or silicidation process.

The remaining unprinted Si regions are unconverted to poly-Si or metal silicide (in crystallization and silicidation, respectively) and need not be removed, a significant process saving step unless required by demands such as stress control or light transmission.

Figure 1:
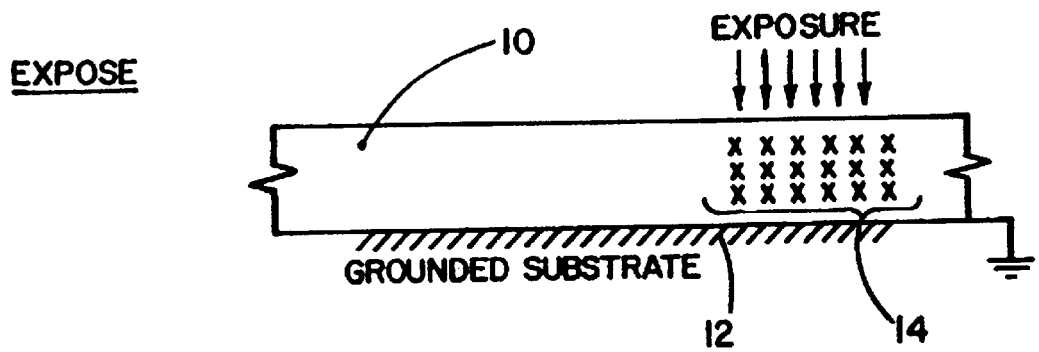
FIG. 1 illustrates a first step in the process of the invention wherein a photosensitive plate material is selectively cross-linked by application of actinic energy.

FIG. 1 shows the first step in the electrostatic printing process of the invention, i.e., the making of the printing plate. A photo-sensitive surface such as a photopolymer material 10, preferably in a dry film form, is laminated to a grounded substrate 12. Photopolymer 10 exhibits the characteristics of photoresists that are used for photolithography applications (e.g., etch resistance). A preferred photopolymer is Dynachem 5038, available from the Dynachem Corporation, Tustin Calif. Another photopolymer that is acceptable is Riston 4615, a product of the Dupont Corporation, Wilmington, Del.

Photopolymer 10 should have the characteristic of crosslinking in areas exposed to actinic energy. As shown in FIG. 1, photopolymer 10 is exposed through a photo tool to actinic radiation in the 300 to 400 nm range or the near ultra violet region of the spectrum. Exposure levels are typically from 50 to 500 millijoules per $cm^2$. Such exposure causes areas 14 to crosslink and at this stage, the plate making step is complete. To achieve selective image-wise charging, a modulated laser beam may be swept across the surface of photo-sensitive material 10 in the manner of a laser printer.

A similar result can be achieved through use of a line of modulated laser diodes that are moved over the surface of photo-sensitive material 10. Further, it is to be understood that while the foregoing description will consider use of a flat plate photopolymer, that the invention can be carried out using a flexible photopolymer that is imaged by either a swept modulated laser beam or a line of modulated laser diodes.

Figure 2:
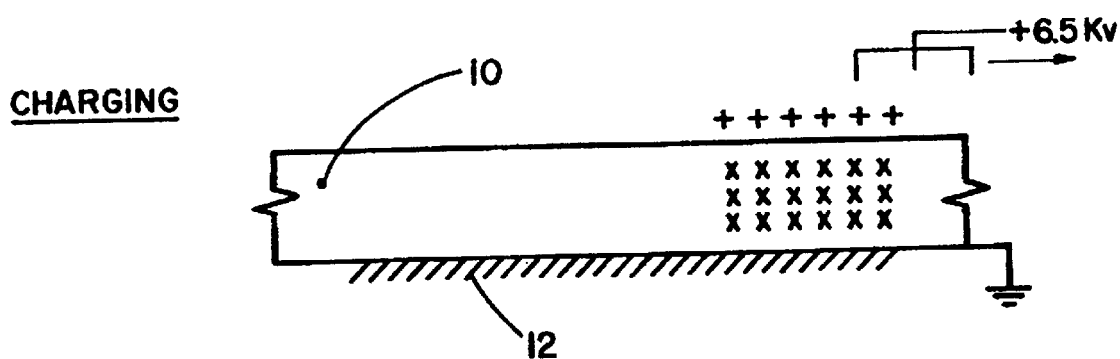
FIG. 2 illustrates a second step in the process of the invention wherein a photosensitive plate material is electrostatically charged.

Photosensitive material 10 is now sensitized by charging it, for example with a corona unit, as shown in FIG. 2. A positive charge is shown as being applied but the photo-sensitive material 10 can accept either positive or negative charge.

Where photo-sensitive material 10 is exposed, the resulting crosslinking raises the electrical resistivity of the material by 4 to 6 orders of magnitude. This enables photo-sensitive material 10 to retain its charge in the crosslinked areas after the charging step, while unexposed regions quickly discharge.

Figure 3:
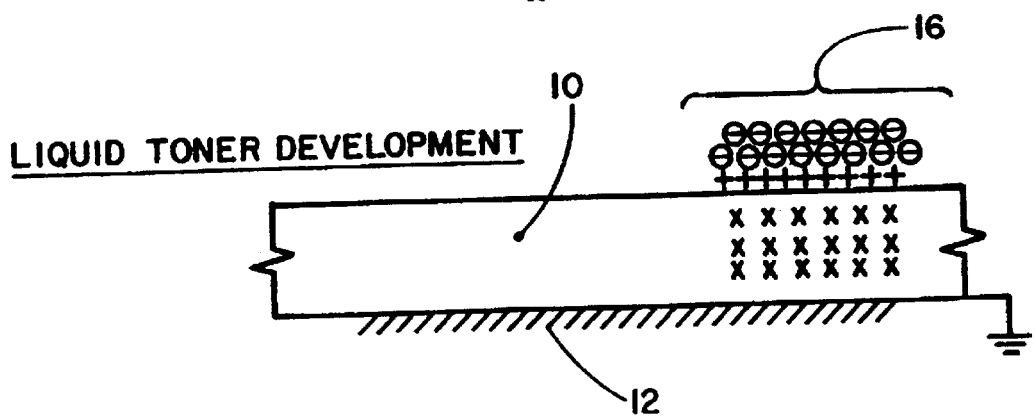
FIG. 3 illustrates a third step in the process of the invention wherein catalyst-containing or metal containing toner is applied to the charged photosensitive plate material.

In FIG. 3, the previously charged areas of photo-sensitive material 10 are "toned" with liquid toner particles as indicated by the negatively charged spheres 16. Each sphere 16 comprises a metal catalyst particle encompassed by a polymeric shell. Details of the method of manufacture of toner particles 16 are given below.

Figure 4:
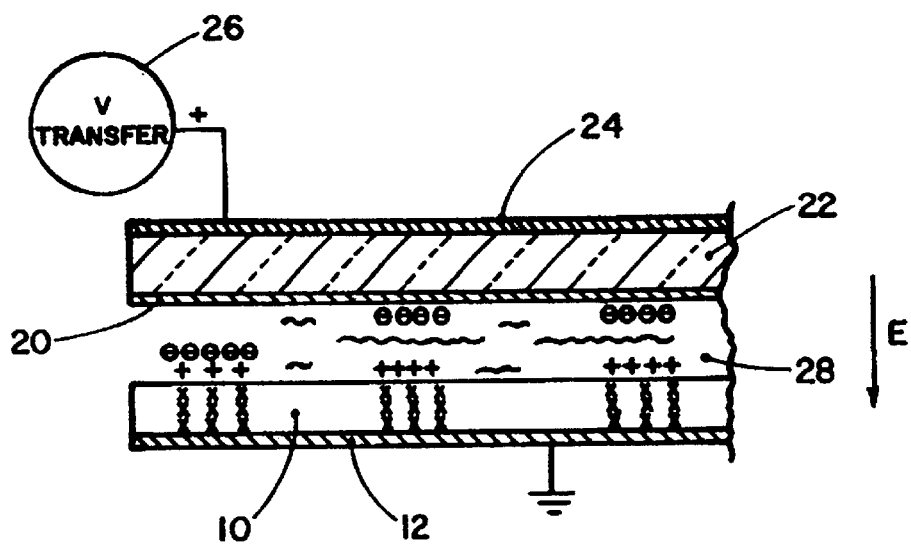
FIG. 4 illustrates a fourth step in the process of the invention wherein the catalyst-containing toner is transferred from the charged photosensitive plate material to an amorphous semiconductor layer (or to a Si surface) by action of an applied electric field.

Next, as shown in FIG. 4, the plate including photo-sensitive material 10 is placed close to a Si surface 20. Here, in particular, the Si surface is that of a Si film 20 coated on a glass substrate 22. A conductive layer 24 is disposed on the opposite face of glass plate 22 and is connected to a voltage supply 26. The region between photo-sensitive material 10 and amorphous silicon layer 20 is filled with a nonconductive fluid, e.g., Isopar G, a product of the Exxon Corporation. The mechanical gap between amorphous silicon layer 20 and photoconductor 10 is preferably of the order of 50 to 150 microns. Thereafter, toner particles 16 are transferred across the fluid filled mechanical gap to amorphous silicon layer 20 by means of an electric field that is created when a transfer voltage is applied to conductor 24 by voltage supply 26. The transfer voltage is typically in the range of 500 to 2000 volts, with a polarity opposite to that of the toner particles. Accordingly, the toner particles are attracted to Si surface 20 by the electric field and remain restricted to areas in alignment with those on photoconductor 10.

In the case of crystallization, the toner "imaged" amorphous silicon layer 20 is now removed and dried before being furnace treated or subjected to a rapid thermal anneal process to produce Poly-Si where the toner was imaged. The selective crystallization of amorphous silicon layer 10 occurs as described by Liu et al. in U.S. Pat. No. 5,147,826 or Fonash et al. in U.S. Pat. No. 5,275,851, both described above and incorporated by reference herein. In the case of silicidation, 20 represents the Si surface (Si wafer, amorphous/poly-Si film) on which a silicide pattern is to be defined. In this case, the toner transfer prior to annealing takes place the same way as described above for the crystallization case.

Figure 5A:
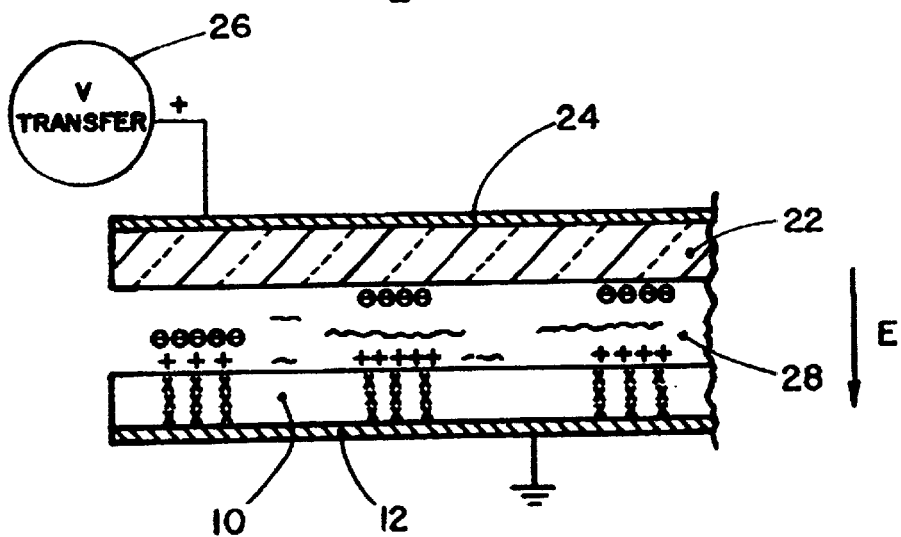
FIGS. 5a, 5b illustrate an alternate fourth step in the process of the invention wherein the metal-containing toner is transferred from the charged photosensitive plate material to a substrate, followed by deposition thereon of a Si or other semiconductor layer and then followed by an anneal operation to achieve selective crystallization or silicidation of the Si layers that are in contact with the toner.
Figure 5B:
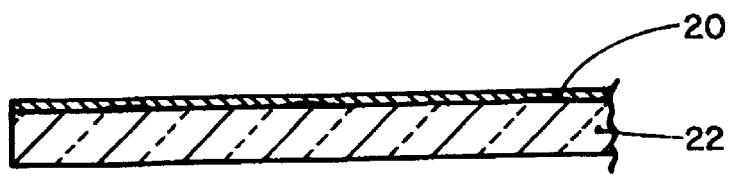

FIG. 5a illustrates an alternate fourth step in the process of the invention wherein the catalyst-containing toner is transferred from charged photosensitive plate material 10 to substrate 22, followed by deposition thereon of amorphous semiconductor layer 20 (FIG. 5b). Then an anneal operation is performed to achieve selective crystallization of the amorphous semiconductor layer portions that are in contact with the toner.

EXAMPLE

Samples of amorphous silicon layers were prepared by RF-PECVD from hydrogen diluted silane at 250° C. on Corning 7059 glass. These amorphous Si layers were then imaged in the following manner:

1.) An electrostatic printing plate ESP-4 from the Electrox Corporation; Newark, N.J. was charged to approximately −1000v by means of a corona charge.
2.) The plate was developed with palladium toner (Electrox EPT1-b) by ordinary means.
3.) Using 125 micron thick polyester film spacer strips, the Si coated glass was spaced away from the ESP-4 plate by a mechanical gap of 125 micron filled with Isopar G (Exxon).
4.) With a voltage of −1500v applied to the amorphous silicon, the palladium toner particles transferred across the gap in an orderly, image wise fashion to the amorphous silicon.
5.) The toned silicon coated Corning 7059 glass was lifted off the ESP-4 plate and spacers and the excess Isopar G liquid was dried.
6.) The amorphous Si layer was subjected to a rapid thermal anneal (PTA) process at 550–600° C. for 5 to 10 minutes at Penn State University. Poly silicon features were demonstrated in the areas covered with the palladium toner.

METAL-CONTAINING TONER COMPOSITION

An organosol toner was selected for use with the present invention. A preferred organosol is similar to organosol compositions reported in U.S. Pat. No. 3,900,412 (G. Kosel). This patent discloses a class of liquid toners that make use of self-stable organosols as polymeric binders to promote self-fixing of a developed latent image. Self-stable organosols are colloidal (0.1–1 micron diameter) particles of polymeric binder which are typically synthesized by non-aqueous dispersion polymerization in a low dielectric hydrocarbon solvent. The organosol particles are sterically-stabilized with respect to aggregation by the use of a physically-adsorbed or chemically-grafted soluble polymer. Details of the mechanism of such steric stabilization are provided by Napper in "Polymeric Stabilization of Colloidal Dispersions", (Academic Press: New York, 1983). Procedures for effecting the synthesis of self-stable organosols, generally involving nonaqueous dispersion polymerization, are known to those skilled in the art and are described in detail in "Dispersion Polymerization in Organic Media", K. E. J. Barrett ed., (John Wiley: New York, 1975).

In simplified terms, nonaqueous dispersion polymerization is a free radical polymerization carried out when one or more ethylenically-unsaturated (typically acrylic) monomers, soluble in a hydrocarbon medium, are polymerized in the presence of a preformed amphipathic polymer. The preformed amphipathic polymer, commonly referred to as the stabilizer, has two distinct functional blocks, one essentially insoluble in the hydrocarbon medium, the other freely soluble. When the polymerization proceeds to a fractional conversion of monomer corresponding to a critical molecular weight, the solubility limit is exceeded and the polymer precipitates from solution, forming a core particle. The amphipathic polymer then either adsorbs onto or covalently bonds to the core, which continues to grow as a discrete particle. The particles continue to grow until monomer is depleted. The adsorbed amphipathic polymer "shell" acts to sterically-stabilize the growing core particles with respect to aggregation. The resulting core/shell polymer particles comprise a self-stable, nonaquecus colloidal dispersion (organosol) comprised of distinct spherical particles in the size (diameter) range 0.1–1 microns.

The composition of the insoluble organosol core is preferentially manipulated such that the organosol exhibits an effective glass transition temperature ($T_g$) of less than the development temperature (typically 23° C.), thus causing a toner composition containing the organosol as a major component to undergo rapid film formation (rapid self fixing) in printing or imaging processes that are carried out at temperatures greater than the core $T_g$. Rapid self fixing is a liquid toner performance requirement to avoid printing defects (such as smearing or loss of image resolution) in high speed printing. The use of low $T_g$ resins to promote rapid self fixing of printed or toned images is known in the art, as exemplified by "Film Formation" (Z. W. Wicks, Federation of Societies for Coatings Technologies, 1986, p. 8).

The resulting organosols can be subsequently converted to a liquid toner by incorporation of the metal catalyst and charge director, followed by high shear homogenization, ball-milling, attritor milling, high energy bead (sand) milling or other means known in the art for effecting particle size reduction in a dispersion. The input of mechanical energy to the dispersion during milling acts to break down aggregated particles into primary particles (0.05–1.0 micron diameter) and to "shred" the organosol into fragments which adhere to the newly-created metal catalyst surface, thereby acting to sterically-stabilize the metal particles with respect to aggregation. The charge director may be physically or chemically adsorbed onto the metal surface, the organosol or both. The result is a sterically-stabilized, charged, nonaqueous metal catalyst dispersion in the size range 0.1–2.0 microns, with typical toner particle diameters between 0.1–0.5 microns.

In summarizing the properties of organosol formulations, it is convenient to denote the composition of each particular organosol in terms of the ratio of the total weight of monomers comprising the organosol core relative to the total weight of graft stabilizer comprising the organosol shell. This ratio is referred to as the core/shell ratio of the organosol. In addition, it will be useful to summarize the compositional details of each particular organosol by rationing the weight percentages of monomers used to create the shell and the core. For example, the preferred organosol can be designated LMA/HEMA-TMI//MMA/EA(97/3–4.7//25/75%w/w), and comprises a shell composed of a graft stabilizer precursor which is a copolymer consisting of 97 weight percent lauryl methacrylate (LMA) and 3 weight percent hydroxyethylmethacrylate (HEMA), to which is covalently bonded a grafting site consisting of 4.7 weight percent TMI (dimethyl-m-isopropanol benzylisocyanate, from CYTEC Industries) based upon the total weight of the graft stabilizer precursor. This graft stabilizer is subsequently covalently bonded to an organosol core which is comprised of 25 weight percent methyl methacrylate (MMA) and 75 weight percent ethyl acrylate (EA). The weight ratio of core to shell in the preferred organosol is adjusted to 4.

The preferred organosol makes use of an IMA/HEMA graft stabilizer precursor which is similar to the LMA/GMA (glycidyl methacrylate—precursor described in Example IV of U.S. Pat. No. 3,900,412; however, the grafting site was changed to permit grafting via formation of a polyurethane linkage between a hydroxyl group and an isocyanate, as opposed to grafting via formation of an epoxide linkage between glycidyl methacrylate and methacrylic acid. The grafting site was changed in order to take advantage of raw materials already available. In addition, the polymerization of the preferred organosol was carried out in ISOPAR L (the carrier liquid selected for use in fabricating toners) using azobisisobutyronitrile (AZDN from Elf-Atochem) as the free radical initiator. The AZDN initiator was selected to provide a higher effective initiator concentration and lower initiator half-life relative to benzoyl peroxide, thereby limiting the molecular weight of the graft stabilizer to values below 500,000 Daltons.

The actual process for making the toner is as follows. Aldrich Chemical Company sells a number of palladium powders, one of which (Product #32666-6) is certified 99.9 percent by weight sub-micron with a number mean diameter of 0.33 micron. A 5 gram sample of this material was acquired and prepared 120 g of the following electroless plating toner was formulated.

Preferred Organosol: 17 g

32666-6 Colloidal Pd: 2 g

Zirconium HEX-CEL (12%) 1 g

ISOPAR L: 100 g

This toner was milled for 1.5 hours @ 2000 RPM using 1–2 mm stainless steel shot. The mean particle size was 0.333 microns. It appears that milling was effective at reducing the palladium powder to primary particles.

An alternate group of materials to serve as metal-containing toners are metallo-organic decomposition (MOD) compounds. MOD compounds are pure synthetic metallo-organic compounds, which decompose cleanly at low temperature to precipitate the metal as the metallic element. The organic moiety is bonded to the metal through a heteroatom providing a weak link that provides for easy decomposition at low temperature. Hence, once heated to 125° C. or higher, (preferably 125° C. to 250° C.) the organic constituents evolve out as $CO_2$ and $H_2O$ or other hydrocarbon fragments leaving a well-bonded metallic trace on the surface, where the MOD compound was applied. Therefore, use of a MOD compound toner in the invention described here excludes the need for metallic particles. In other words, the function of the MOD compound is two-fold; (1) electrographic (charging), similar to organosol, and (2) to contain the metal; the catalyst for crystallization of an amorphous semiconductor layer (e.g., Pd, Ni, Cr, Pt) or the essential ingredient for converting a Si surface to a certain metal-silicide. The MOD compound functions electrographically by serving as the charge control agent bound to the particle which forms acid/base couples with the charge director dissolved in the diluent liquid. Use of a MOD toner is advantageous for the following reasons. First, the metal is contained chemically in the toner solution, and therefore the distribution of metal is very uniform (in the molecular scale). On the other hand, when metal is included in toner in terms of particles, the resolution of the metal print will be limited by the particle size as well as how good the metal particles are distributed. Second, since MOD reduces to a pure metal upon low temperature annealing, there won't be an organic residue blocking the diffusion of metal to semiconductor surface during crystallization or silicidation. For these reasons, the reproducibility is improved significantly. Examples of several MOD compounds are; silver neodecanoate, gold amine 2-ethylhexanoate, platinum amine 2-ethyl hexanoate which are listed in the U.S. Pat. No. 6,036,889, and can be used to print the noble metals Ag, Au, and Pt, respectively. MOD compounds containing catalyst metals for crystallization (also applicable to silicidation) are palladium(II) acetate ($Pd(Oac)_2$), palladium(II) formate, palladium(II) propionate, palladium(II) fumarate, palladium(II) stearate, palladium(II) benzoate, diacetatobis (triphenylphosphine) palladium(II), (U.S. Pat. No. 5,332,646), palladium neodecanoate (U.S. Pat. No. 4,262,040), and nickel formate $Ni(HCO_2)_2$ (U.S. Pat. No. 3,897,285). Also, several MOD compounds, which contain catalyst metals for crystallization are produced by Engelhard Co., N.J., and are sold under the catalog names 52D (Cr), A6051 (Cr), 58A (Ni), A2985 (Pd), A1121 (Pt), A6054A (Pt), M603B (Pt).

The toner may also be composed of metal particles coated with a MOD compound coating. In this case, the MOD coating need not even contain the same metal as the particle to be coated. For instance, 50 nm Pd particles could have a thin layer of silver neodeconoate as a charge control agent. Once printed and dried, the Pd particle would have trace levels of silver on it. Then, in crystallization, the primary catalytic function is performed by the palladium particle, with the silver, inert to further processing.

It should be understood that the foregoing description is only illustrative of the invention. Various alternatives and modifications can be devised by those skilled in the art without departing from the invention. In particular, annealing can be carried out by variety of means, e.g., furnace annealing, rapid thermal annealing, inductive heating, microwave heating, etc. Furthermore, the processed material can be a material other than Si, e.g., carbon, germanium and alloys thereof. In case of a thin film material, it may reside on various substrates, e.g., silicon, metal, glass or plastics. The toner can generally contain the catalyst (for crystallization, e.g., Pd, Ni, Pt, Cr) or metal (for silicidation, i.e., metal of desired silicide) either chemically (the toner is a compound or solution of the metal) or physically (the metal is contained in the toner in terms of particles) or both. Accordingly, the present invention is intended to embrace all such alternatives, modifications and variances which fall within the scope of the appended claims.

What is claimed is:

1. A method for applying metallic toner onto an amorphous semiconductor layer with the objective of selective area crystallization, said method comprising the steps of:
    (a) exposing a photo-sensitive surface to cause exposed areas of said surface to crosslink and exhibit an increase in resistivity in comparison with unexposed areas of said photo-sensitive surface;
    (b) charging said photo-sensitive surface, said exposed areas of said photo-sensitive surface retaining a charge longer than said unexposed areas;
    (c) applying a toner to said photo-sensitive surface, said toner attracted by retained charge on said exposed areas;
    (d) juxtaposing said photo-sensitive surface toned in step (c) to a layer of amorphous semiconductor and applying an electric field therebetween to cause said toner that is adherent to said photo-sensitive surface to migrate to said amorphous semiconductor layer; and
    (e) annealing said toned amorphous semiconductor layer to enable formation of polycrystalline semiconductor only in areas where said toner is adherent.

2. The method as recited in claim 1, wherein said photo-sensitive surface comprises a material selected from the group consisting of: epoxy cationic, acrylic free radical, and photo-sensitive polyimide.

3. The method as recited in claim 1, wherein said toner contains a metal and said metal is in a form selected from the group consisting of: metal complex, pure metal particle, coated metal, and organometallic compound.

4. The method as recited in claim 3, wherein said toner is a material selected from the group consisting of: a resin with metal particle s , an organosol with metal particles, a metallo-organic decomposition compound, and a metallo-organic decomposition compound with metal particles.

5. The method as recited in claim 4, wherein said metal or said metal particle is selected from the group consisting of: palladium, silver, tin, nickel, platinum, chromium and mixtures thereof.

6. The method as recited in claim 1, wherein step (d) further comprises interposing a nonconductive fluid between said photo-sensitive surface and said layer of amorphous semiconductor prior to applying said electric field.

7. The method as recited in claim 1, wherein said amorphous semiconductor layer comprises a material selected from a group consisting of: silicon, germanium, silicon-germanium, silicon-carbide, cadmium selenide, and indium antimonide.

8. The method as recited in claim 1, wherein said amorphous semiconductor layer is disposed on a substrate.

9. The method as recited in claim 8, wherein said substrate comprises at least one material selected from the group consisting of silicon, metal, glass, and plastic.

10. A method for applying metallic toner onto an amorphous semiconductor layer with the objective or selective area crystallization, said method comprising the steps of:
    (a) charging a photo-sensitive surface;
    (b) exposing said photo-sensitive surface to an optical image or a digitally addressed beam to produce a latent image of charges on the photo-sensitive surface;
    (c) applying a toner to said photo-sensitive surface, said toner attracted to the charged areas of said photo-sensitive surface;
    (d) juxtaposing said photo-sensitive surface toned in step (c) to a layer of amorphous semiconductor and applying an electric field therebetween to cause said toner that is adherent to said photo-sensitive surface to migrate to said amorphous semiconductor layer; and
    (e) annealing said toned amorphous semiconductor layer to enable formation of polycrystalline semiconductor only in areas where said toner is adherent.

11. The method as recited in claim 10, wherein said photo-sensitive surface comprises a material selected from the group consisting of: organic photoreceptor surface, arsenic triselenide, selenium, and silicon.

12. A method for the formation of silicide on a silicon surface comprising the steps of:
    (a) exposing a photo-sensitive surface to cause exposed areas of said surface to crosslink and exhibit an increase in resistivity in comparison with unexposed areas of said photo-sensitive surface;
    (b) charging said photo-sensitive surface, said exposed areas of said photo-sensitive surface retaining a charge longer than said unexposed areas;
    (c) applying a toner to said photo-sensitive surface, said toner attracted by retained charge on said exposed areas;
    (d) juxtaposing said photo-sensitive layer surface toned in step (c) to a silicon surface and applying an electric field therebetween to cause said toner that is adherent to said photo-sensitive surface to migrate to said silicon surface; and
    (e) annealing said toned silicon surface thereby enabling formation of silicide only in areas where said toner is adherent.

13. The method as recited in claim 12, wherein said photo-sensitive surface comprises a material selected from the group consisting of: epoxy cationic, acrylic free radical, and photo-sensitive polyimide.

14. The method as recited in claim 12, wherein the silicon surface is amorphous, polycrystalline, or single crystalline.

15. The method as recited in claim 12, wherein said toner contains a metal and said metal is in a form selected from the group consisting of metal complex, pure metal particle, coated metal, and organometallic compound.

16. The method as recited in claim 15, wherein said toner is selected from the group consisting of: a resin with metal particles, an organosol with metal particles, a metallo-organic decomposition compound, and a metallo-organic decomposition compound with metal particles.

17. The method as recited in claim 16, wherein said metal or metal particle is selected from the group consisting of: aluminum, cobalt, chromium, hafnium, iron, magnesium, molybdenum, nickel, niobium, palladium, platinum, tantalum, titanium, tungsten, zirconium and mixtures thereof.

18. The method as recited in claim 12, wherein step (d) further comprises interposing a nonconductive fluid between said photo-sensitive surface and said silicon surface prior to applying said electric field.

19. The method as recited in claim 12, wherein said silicon surface is an amorphous or polycrystalline silicon thin film disposed on a substrate.

20. The method as recited in claim 19, wherein said substrate comprises at least one material selected from the group consisting of: silicon, metal, glass, and plastic.

21. A method for the formation of suicide on a silicon surface comprising the steps of:

(a) charging a photo-sensitive surface;

(b) exposing said photo-sensitive surface to an optical image or a digitally addressed beam to produce a latent image of charges on the photo-sensitive surface;

(c) applying a toner to said photo-sensitive surface, said toner attracted to the charged areas of said photo-sensitive surface;

(d) juxtaposing said photo-sensitive layer surface toned in step (c) to a silicon surface and applying an electric field therebetween to cause said toner that is adherent to said photo-sensitive surface to migrate to said silicon surface; and (e) annealing said toned silicon surface thereby enabling formation of silicide only in areas where said toner is adherent.

22. The method as recited in claim 21, wherein said photo-sensitive surface comprises a material selected from the group consisting of: organic receptor surface, arsenic triselenide, selenium, and silicon.

* * * * *